(12) United States Patent
Higaki

(10) Patent No.: US 8,765,328 B2
(45) Date of Patent: Jul. 1, 2014

(54) EXPOSURE MASK AND METHOD FOR MANUFACTURING SAME AND METHOD FOR MANUFACTURING SEMICONDUCTOR DEVICE

(75) Inventor: Tomotaka Higaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 297 days.

(21) Appl. No.: 12/727,652

(22) Filed: Mar. 19, 2010

(65) Prior Publication Data

US 2010/0304281 A1    Dec. 2, 2010

(30) Foreign Application Priority Data

May 29, 2009   (JP) .................................. 2009-131463

(51) Int. Cl.
*G03F 1/36* (2012.01)

(52) U.S. Cl.
USPC ............................................................ 430/5

(58) Field of Classification Search
CPC ........................................................ G03F 1/36
USPC ............................................................ 430/5
See application file for complete search history.

(56) References Cited

U.S. PATENT DOCUMENTS

| | | | |
|---|---|---|---|
| 5,217,834 A | 6/1993 | Higaki | |
| 5,723,234 A | 3/1998 | Yokoyama et al. | |
| 5,795,682 A * | 8/1998 | Garza | 430/5 |
| 6,558,853 B1 | 5/2003 | Kawamura | |
| 6,881,523 B2 * | 4/2005 | Smith | 430/5 |
| 2002/0192571 A1* | 12/2002 | Schwarzl | 430/5 |
| 2005/0019674 A1* | 1/2005 | Okubo et al. | 430/5 |
| 2009/0081564 A1* | 3/2009 | Yasuzato | 430/5 |

FOREIGN PATENT DOCUMENTS

| | | |
|---|---|---|
| JP | 6-266095 | 9/1994 |
| JP | 7-181669 | 7/1995 |
| JP | 8-234410 | 9/1996 |
| JP | 2001-92105 | 4/2001 |
| JP | 2001-100390 | 4/2001 |
| JP | 2004-219587 | 8/2004 |
| JP | 2006-30221 | 2/2006 |
| JP | 2009-80143 | 4/2009 |
| KR | 10-0496371 | 6/2005 |
| KR | 10-2005-0119164 | 12/2005 |

OTHER PUBLICATIONS

Notification of Comments issued by the Korean Patent Office on Oct. 20, 2011, for Korean Patent Application No. 10-2010-18972, and English-language translation thereof.

(Continued)

*Primary Examiner* — Mark F Huff
*Assistant Examiner* — John S Ruggles
(74) *Attorney, Agent, or Firm* — Finnegan, Henderson, Farabow, Garrett & Dunner, L.L.P.

(57) ABSTRACT

An exposure mask used to transfer a pattern defined by exposure onto a wafer, includes: a substrate; a pattern formation region provided on the substrate, and having pattern elements formed therein, the pattern elements having a size not smaller than a resolution limit after being transferred onto the wafer; and a sub-pattern formation region provided on the substrate and having sub-pattern elements formed therein. The sub-pattern element has a size smaller than the resolution limit after being transferred onto the wafer, and the sub-pattern formation region is spaced from the pattern formation region by a distance having no optical proximity effect on the pattern.

9 Claims, 14 Drawing Sheets

(56) References Cited

OTHER PUBLICATIONS

Notification of Reason(s) for Refusal issued by the Japanese Patent Office on Dec. 18, 2012, for Japanese Patent Application No. 2009-131463, and English-language translation thereof.

Notification of the Examination Opinion issued by the Taiwanese Intellectual Property Office on Sep. 2, 2013, for Taiwanese Patent Application No. 099103990, and English-language translation thereof.

* cited by examiner

EXPOSURE MASK AND METHOD FOR
MANUFACTURING SAME AND METHOD
FOR MANUFACTURING SEMICONDUCTOR
DEVICE

CROSS-REFERENCE TO RELATED
APPLICATIONS

This application is based upon and claims the benefit of priority from the prior Japanese Patent Application No. 2009-131463, filed on May 29, 2009; the entire contents of which are incorporated herein by reference.

BACKGROUND

1. Field

Embodiments of the invention relate generally to an exposure mask and a method for manufacturing the same and a method for manufacturing a semiconductor device.

2. Background Art

In the manufacturing of semiconductor devices, such as LSI (large scale integrated circuit) and flash memories, photolithography technology is frequently used. In the photolithography technology, a resist film is formed on a wafer, and the resist film is exposed through an exposure mask, such as photomask or EUV (extreme ultraviolet) mask and developed to pattern the resist film. Then, the patterned resist film is used as a mask to form miniaturized structures in the wafer. Thus, the demands for dimensional precision of a pattern formed on the exposure mask are increased with the downscaling of semiconductor devices (for example, refer to JP-A 2006-30221 (Kokai)).

SUMMARY

According to an aspect of the invention, there is provided an exposure mask used to transfer a pattern defined by exposure onto a wafer, including: a substrate; a pattern formation region provided on the substrate, and having pattern elements formed therein, the pattern elements each having a size not smaller than a resolution limit after being transferred onto the wafer; and a sub-pattern formation region provided on the substrate and having sub-pattern elements formed therein, each of the sub-pattern elements having a size smaller than the resolution limit after being transferred onto the wafer. The sub-pattern formation region is spaced from the pattern formation region by a distance having no optical proximity effect on the pattern formation region. At least a portion of the sub-pattern elements each extends in a first direction. The pattern elements are arranged at a smallest pitch of the pattern elements each extending in a second direction. The first direction intersects the second direction.

According to another aspect of the invention, there is provided a method for manufacturing an exposure mask used to transfer a pattern defined by exposure onto a wafer, including: forming a resist film on a structure having a pattern forming film formed on a substrate; exposing the resist film; developing the resist film after the exposure to selectively remove the resist film; and selectively removing the pattern forming film by etching using the selectively removed resist film as a mask, the exposing the resist film including drawing pattern elements in a pattern formation region, the pattern elements each having a size not smaller than a resolution limit after being transferred onto the wafer, and drawing sub-pattern elements in a sub-pattern formation region, each of the sub-pattern elements having a size smaller than the resolution limit after being transferred onto the wafer, the sub-pattern formation region being spaced from the pattern formation region by a distance having no optical proximity effect on the pattern formation region.

According to another aspect of the invention, there is provided a method for manufacturing a semiconductor device, including: forming a resist film on a wafer; and exposing the resist film using an exposure mask, a mask including a pattern formation region having pattern elements formed therein and a sub-pattern formation region having sub-pattern elements formed therein on a substrate being implemented as the exposure mask, the sub-pattern formation region being spaced from the pattern formation region by a distance having no optical proximity effect on the pattern formation region, the exposing including transferring the pattern onto the wafer and not transferring the sub-pattern onto the wafer.

DETAILED DESCRIPTION

Embodiments of the invention will now be described with reference to the drawings.

At the outset, a first embodiment of the invention is described.

Figure 1:
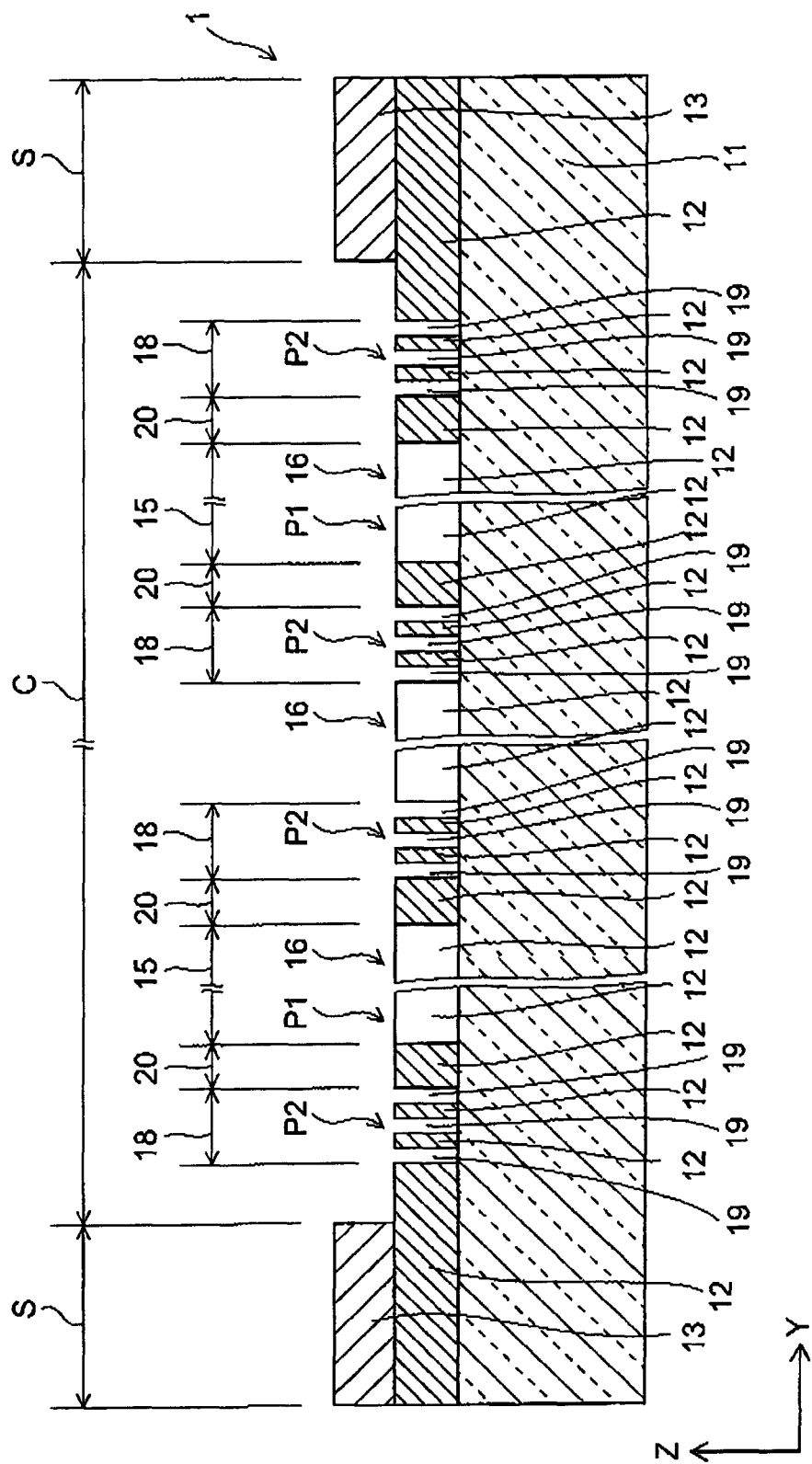
FIG. 1 is a cross-sectional view illustrating an exposure mask according to a first embodiment of the invention.

FIG. 1 is a cross-sectional view illustrating an exposure mask according to this embodiment.

Figure 2:
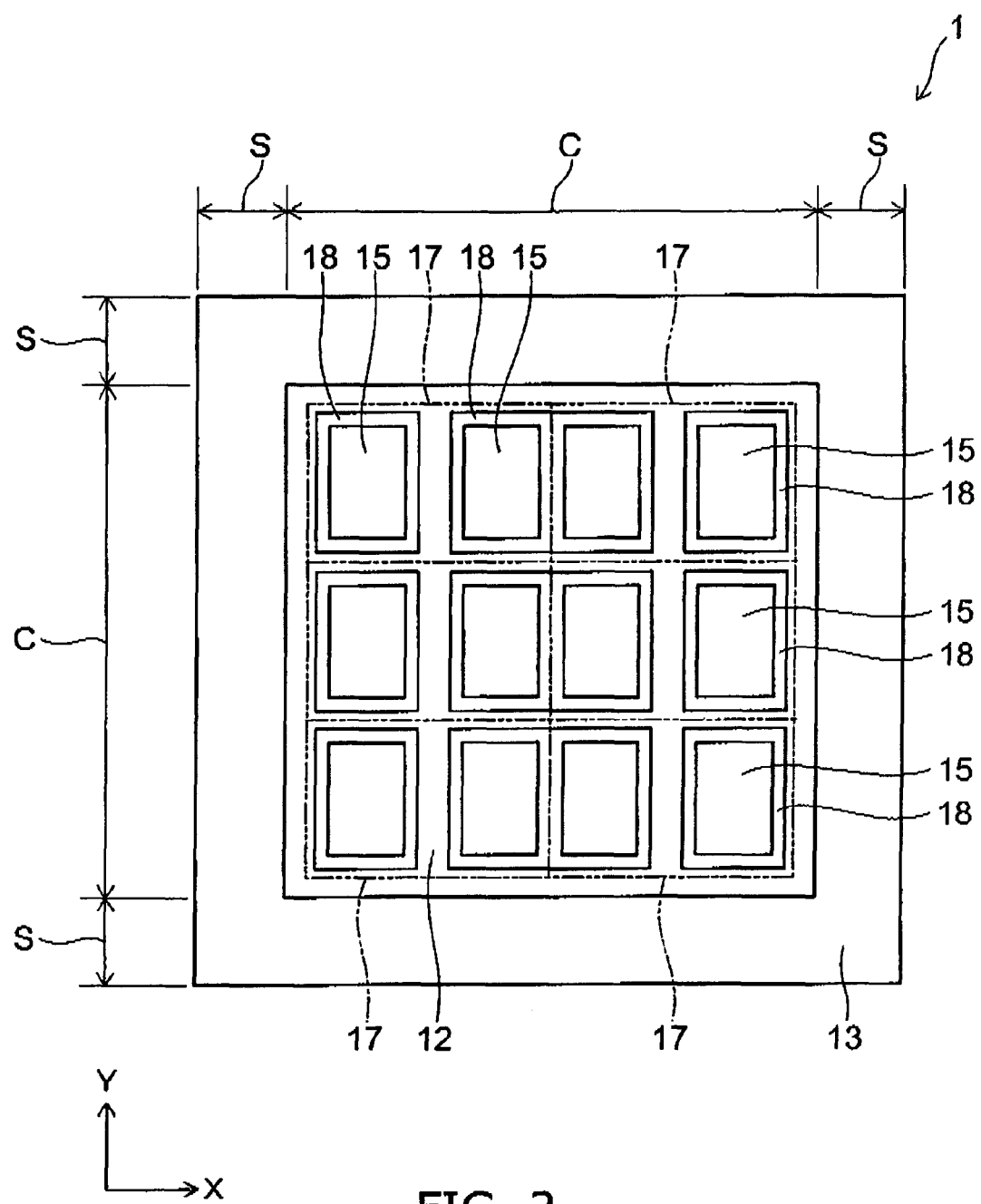
FIG. 2 is a plan view illustrating the exposure mask according to the first embodiment.

FIG. 2 is a plan view illustrating the exposure mask according to this embodiment.

Figure 3:
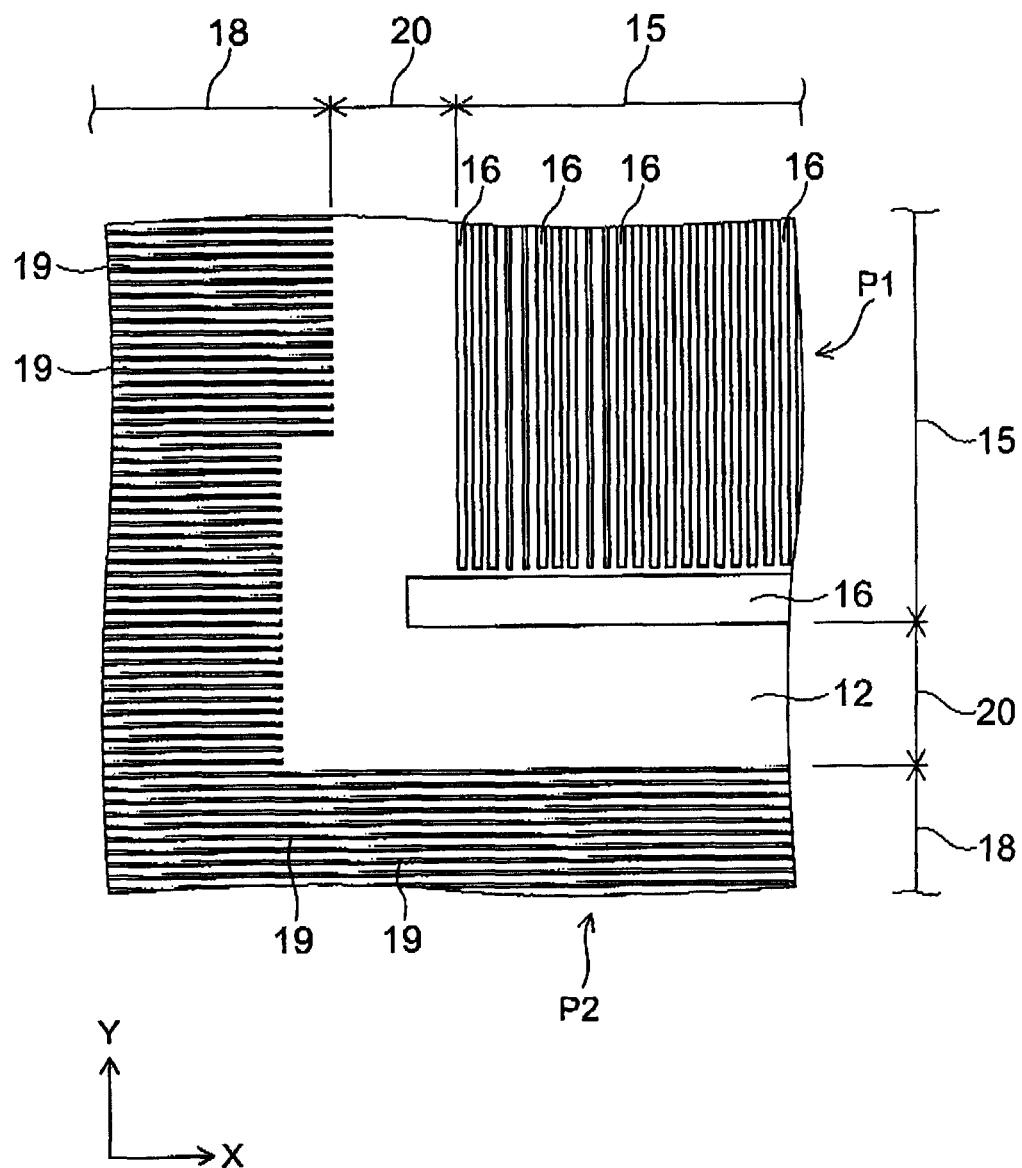
FIG. 3 is a partially enlarged plan view illustrating the exposure mask shown in FIG. 2.

FIG. 3 is a partially enlarged plan view illustrating the exposure mask shown in FIG. 2.

For convenience of explanation, in FIGS. 1 to 3, an XYZ orthogonal coordinate system is defined. Moreover, for convenience of illustration, the dimensions of various portions are appropriately adjusted and are not consistent across the figures, and yet do not correspond to those of an actual product.

An exposure mask according to this embodiment is an exposure mask usable to transfer a pattern defined by exposure onto a wafer for manufacturing a semiconductor device, and the exposure mask is a transmissive photomask.

As shown in FIG. 1, the exposure mask 1 according to this embodiment includes a substrate 11 and a halftone film 12. The halftone film 12 is formed as a pattern forming film on substantially the whole surface of the substrate 11. Further, a light shielding film 13 is continuously formed in a peripheral section S of the exposure mask 1. The substrate 11 is a substrate transmissive to the light used for the exposure operation (exposure light) and is formed of, e.g., quartz. The substrate 11 is of plate-like form and is of rectangular shape, e.g., square shape whose side is 152 mm. The halftone film 12 is a film blocking nearly all of exposure light, e.g., 94% of incident exposure light and allowing 6% through. The halftone film 12 is formed of, e.g., molybdenum silicide (MoSi) and to a thickness of, e.g., 69 nm. The light shielding film 13 is a film blocking substantially all of incident exposure light. The light shielding film 13 is formed of, e.g., chromium (Cr) and to a thickness of, e.g., 50 nm. The light shielding film 13 is formed as a continuous film in a frame-shaped region along the outer periphery of the exposure mask 1.

As shown in FIGS. 1 to 3, pattern formation regions 15 are provided in a central section C of the exposure mask 1. The pattern formation regions 15 are provided in a plurality of locations, e.g., in twelve locations in the example shown in FIG. 2. The pattern formation regions 15 are arranged in a matrix-like arrangement and spaced apart from one another. Each pattern formation region 15 is, e.g., a rectangle in shape. In the pattern formation region 15, the halftone film 12 is selectively removed to form a pattern P1 including pattern elements 16. Since the pattern elements 16 are sized such that pattern elements after being transferred onto a wafer are not smaller than a resolution limit, the pattern P1 is transferred onto the wafer during exposure. In this embodiment, an arrangement pitch of pattern elements extending in the Y-direction in the figure of the pattern elements 16 is smaller than an arrangement pitch of pattern elements extending in the X-direction in the figure. Further, in this embodiment, a chip area 17 including a pair of the pattern formation regions 15 corresponds to one semiconductor device to be manufactured. Specifically, one chip is fabricated at each chip area 17 after being transferred onto the wafer.

A sub-pattern formation region 18 is provided around the pattern formation region 15. The sub-pattern formation region 18 is in the shape of a frame surrounding the pattern formation region 15 and is, e.g., 2 mm in width. Further, the sub-pattern formation regions 18 respectively surrounding the closely adjacent pattern formation regions 15 are merged together and the sub-pattern formation regions 18 respectively surrounding the widely spaced adjacent pattern formation regions 15 are spaced from each other.

In the sub-pattern formation region 18, the halftone film 12 is selectively removed to form a sub-pattern P2 including sub-pattern elements 19. The sub-pattern elements 19 are sized such that sub-pattern elements after being transferred onto the wafer during exposure are smaller than the resolution limit. Accordingly, the sub-pattern P2 is not transferred onto the wafer. The sub-pattern P2 includes a plurality of line-shaped portions extending in the X-direction. Specifically, the direction (X-direction) in which the sub-pattern elements 19 extend is perpendicular to the direction (Y-direction) in which those pattern elements 16 that are arranged at a smallest pitch of the pattern elements 16 extend.

A pitch at which the sub-pattern elements 19 are arranged satisfies the following relationship (1):

$$R < 0.25 \times \lambda / NA \quad (1)$$

where R is one-half of the pitch (half pitch) of images of the sub-pattern elements 19 after being projected onto the wafer, NA is a numerical aperture of a lens used for exposure, and λ is a wavelength of a light used for the exposure operation (exposure light). Incidentally, the coefficient (0.25) in the above relationship (1) depends on photoresist process parameters and generally referred to as "coefficient $k_1$".

For example, when the numerical aperture of a lens is 1.35 and the wavelength of exposure light is 193 nm, R<35.7 nm results from the above relationship (1). Then, if the reduction magnification during exposure is one fourth (¼), the above relationship (1) is valid when the half pitch of the sub-pattern elements 19 of the exposure mask 1 is smaller than about 143 nm.

As shown in FIG. 3, the sub-pattern formation region 18 is spaced from the pattern formation region 15 by a distance having no optical proximity effect from the sub-pattern P2 to the pattern P1. The halftone film 12 is continuously formed between the sub-pattern formation region 18 and pattern formation region 15, and a gap region 20 is present where neither the pattern elements 16 nor the sub-pattern elements 19 are formed. The minimum limit distance having no optical proximity effect depends on exposure conditions such as intensity of the exposure light and the numerical aperture of the lens, etc. When the minimum limit distance is not easily determined, the minimum limit distance is, for example, 1 micrometer. Accordingly, the sub-pattern formation region 18 is preferably spaced from the pattern formation region 15 by not less than 1 micrometer, and is, for example, spaced by 1.8 micrometers.

Next, a method for manufacturing an exposure mask according to this embodiment is described.

FIGS. 4A to 4C and FIGS. 5A to 5C are cross-sectional views of processes showing the method for manufacturing the exposure mask according to this embodiment.

Figure 4A:
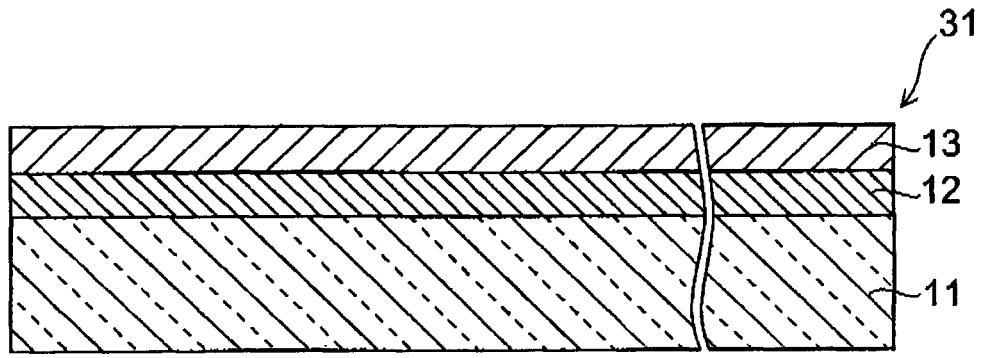
FIGS. 4A to 4C and FIGS. 5A to 5C are cross-sectional views of processes showing a method for manufacturing an exposure mask according to the first embodiment.

First, as shown in FIG. 4A, a structure 31 is prepared. In structure 31, a halftone film 12 and a light shielding film 13 are laminated in this order over the whole surface on the substrate 11.

Figure 4B:
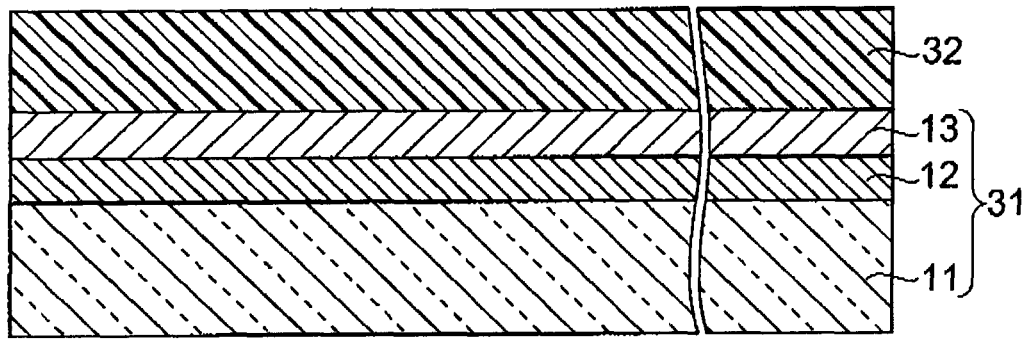

Next, as shown in FIG. 4B, a resist film 32 is formed over the whole surface on the structure 31. The resist film 32 is formed of an electron-beam sensitized material and its thickness is, e.g., 150 nm.

Figure 4C:
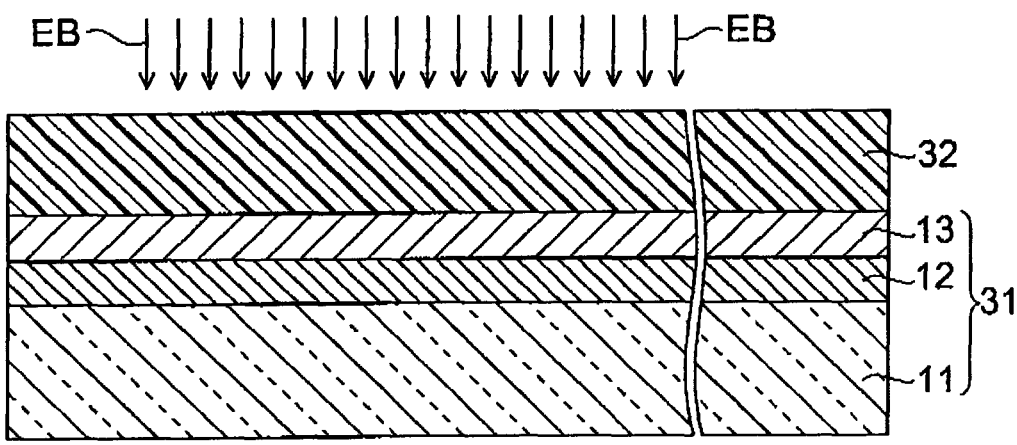

Then, as shown in FIG. 4C, an electron-beam EB is selectively irradiated on the resist film 32, thereby exposing the resist film 32. In this case, the pattern elements 16 (see FIG. 3) are drawn in the pattern formation region 15 (see FIG. 2) of the structure 31 in such a manner that the size of pattern elements 16 after being transferred onto the wafer is not smaller than the resolution limit, while the sub-pattern elements 19 (see FIG. 3) are drawn in the sub-pattern formation region 18 (see FIG. 2) in such a manner that the size of the sub-pattern elements 19 after being transferred onto the wafer is smaller than the resolution limit. Further, the sub-pattern formation region 18 is disposed to surround the pattern formation region 15 and spaced from the pattern formation region 15 by a distance having no optical proximity effect on the pattern P1. Specifically, when the resist film 32 is formed of a positive-type resist material, the electron-beam EB is irradiated onto regions where the pattern elements 16 and sub-pattern elements 19 are to be formed.

In this case, at least a portion of the sub-pattern elements 19 are drawn to extend in a direction intersecting the direction in which pattern elements 16 that are arranged at the smallest pitch of the pattern elements 16 extend. For example, in this embodiment, the pattern elements 16 that are arranged at the smallest pitch of the pattern elements 16 extend in the Y-direction and accordingly, the sub-pattern P2 is a line-and-space pattern extending in the X-direction.

Figure 5A:
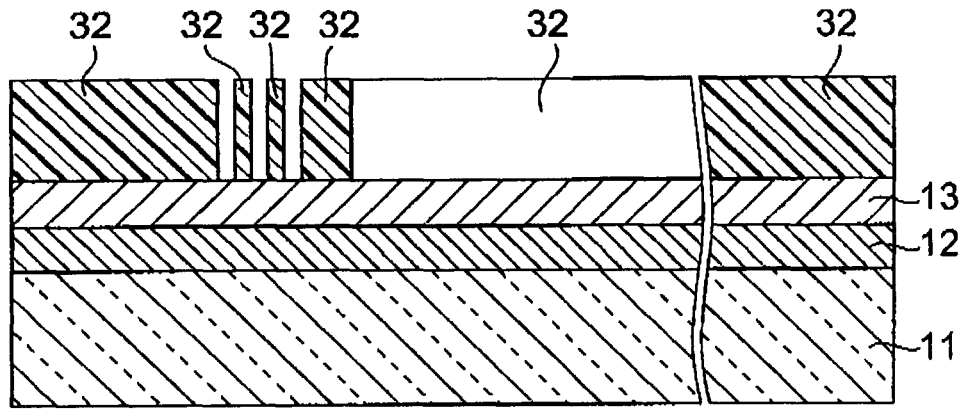

As shown in FIG. 5A, the resist film 32 is developed. Thus, a portion of the resist film 32 that is irradiated with the electron-beam EB is dissolved and selectively removed. Consequently, the resist film 32 is patterned.

Figure 5B:
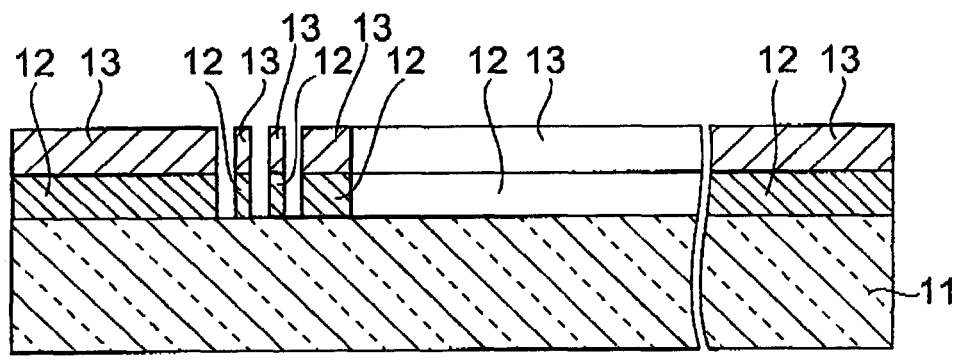

Then, as shown in FIG. 5B, etching is carried out using the patterned resist film 32 as a mask. Accordingly, the light shielding film 13 and halftone film 12 are patterned and removed from regions where the pattern elements 16 and the sub-pattern elements 19 are to be formed. Afterwards, the resist film 32 is removed.

Figure 5C:
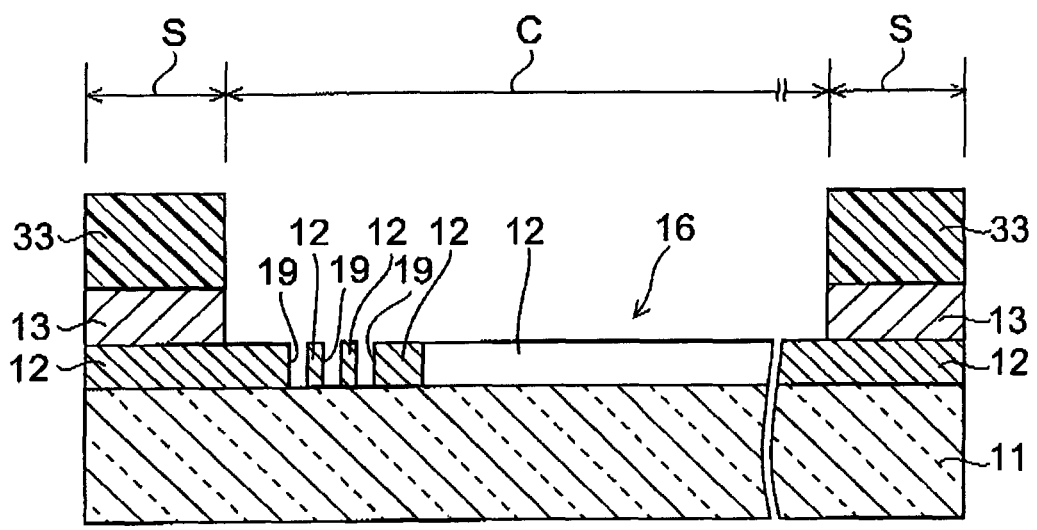

As shown in FIG. 5C, a resist film 33 is formed so that the peripheral section S is covered and the central section C is exposed. Then, etching is carried out using the resist film 33 as a mask to remove the light shielding film 13 from the central section C while leaving the halftone film 12. Consequently, the pattern elements 16 produced by selectively removing the halftone film 12 are formed in the pattern formation region 15 and the sub-pattern elements 19 produced by selectively removing the halftone film 12 are formed in the sub-pattern formation region 18. In contrast, both the halftone film 12 and light shielding film 13 are left in the peripheral section S. Afterwards, the resist film 33 is removed. Thus, the manufacture of the exposure mask 1 according to this embodiment is completed.

Next, a method for using the exposure mask according to this embodiment, namely, a method for manufacturing a semiconductor device according to this embodiment is described.

Figure 6:
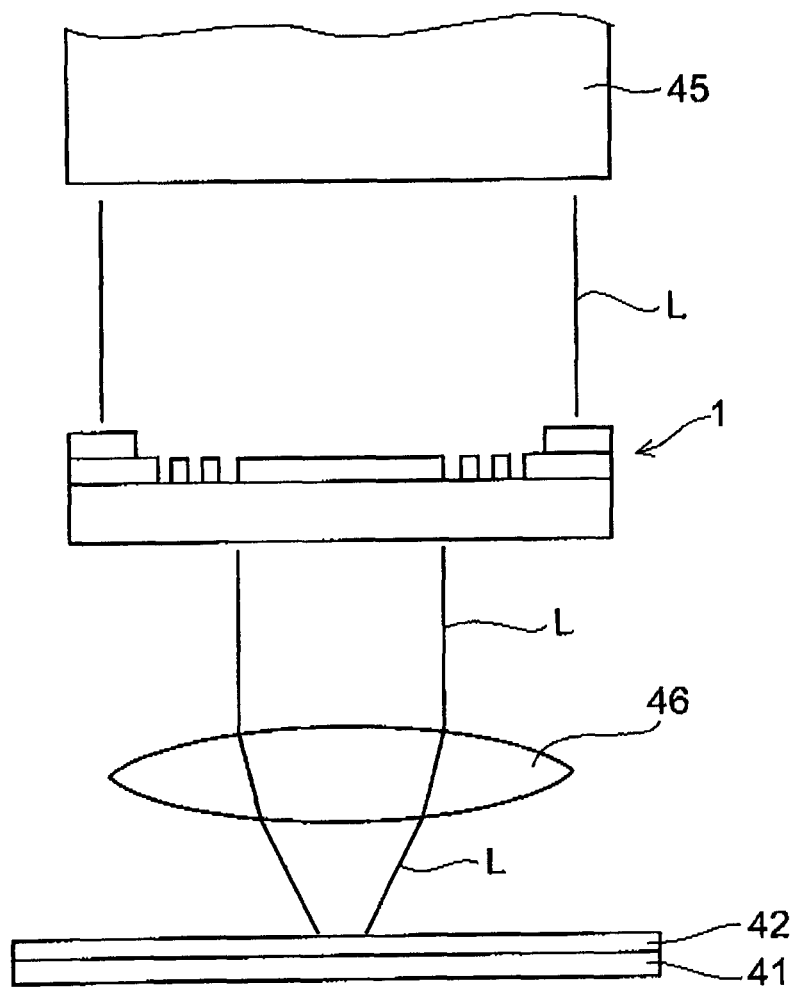
FIG. 6 is an optical model diagram schematically illustrating a method for manufacturing a semiconductor device according to the first embodiment.

FIG. 6 is an optical model diagram schematically illustrating the method for manufacturing the semiconductor device according to this embodiment.

As shown in FIG. 6, first, a silicon wafer 41 is prepared and a resist film 42 is formed on the silicon wafer 41.

Then, the resist film 42 is exposed using the above exposure mask 1. Specifically, an exposure optical system including a light source 45 emitting exposure light L and a lens 46 focusing the exposure light L is provided and the exposure mask 1 is interposed between the light source 45 and lens 46 in the optical system, and the silicon wafer 41 is placed at a position at which rays of the exposure light L from the lens 46 converge. In this case, the exposure light L is implemented as light polarized in a direction in which pattern elements arranged at a smallest pitch of the pattern elements 16 of the exposure mask 1 extend.

In such an optical system, when the light source 45 irradiates the exposure light L onto the exposure mask 1, the exposure light L selectively passes through the exposure mask 1, on which the halftone film 12 and light shielding film 13 have been selectively formed, and is incident on the lens 46. Then, the exposure light L is focused by the lens 46 and is incident on the resist film 42 formed on the silicon wafer 41. In this case, the beam diameter of the exposure light L passing through the lens 46 is reduced to, e.g., one-fourth (¼).

Thus, the resist film 42 is selectively exposed. In this case, the pattern elements 16 are sized such that pattern elements after being transferred onto the silicon wafer 41 are not smaller than the resolution limit and then are imaged on the resist film 42. In contrast, the sub-pattern elements 19 are sized such that pattern elements after being transferred onto the silicon wafer 41 are smaller than the resolution limit and then are not imaged on the resist film 42.

Incidentally, assuming that R is one-half of the pitch (half pitch) at which the images of the sub-pattern elements 19 projected at a ratio of 4:1 onto the wafer are arranged, NA is the numerical aperture of the lens 46, and λ is the wavelength of the exposure light L, these parameters R, NA, and λ are linked by the above relationship (1). Further, in FIG. 6, optical elements other than the light source 45 and lens 46 have been omitted, although a more complex optical system is configured in the actual exposure apparatus.

Then, the resist film 42 is developed. Thus, the pattern P1 of the exposure mask 1 is transferred onto the resist film 42 and the resist film 42 is patterned. In contrast, the sub-pattern P2 of the exposure mask 1 is not transferred onto the resist film 42. Specifically, the presence of the sub-pattern P2 on the exposure mask 1 hardly affects the patterning of the resist film 42.

Subsequently, the silicon wafer 41 is subjected to a treatment, such as etching, impurity implantation, or the like, using the patterned resist film 42 as a mask. Thus, the silicon wafer 41 is processed. Afterwards, further standard process flow is followed to complete the semiconductor device.

Next, the function and effect of this embodiment are described.

In this embodiment, the sub-pattern P2 is provided around the pattern formation region 15. Thus, variations in the size of the pattern elements 16 in a peripheral portion of the pattern formation region 15 can be prevented during the manufacturing of the exposure mask 1.

In the following, this effect is described in detail with reference to a comparative example of this embodiment.

Figure 7:
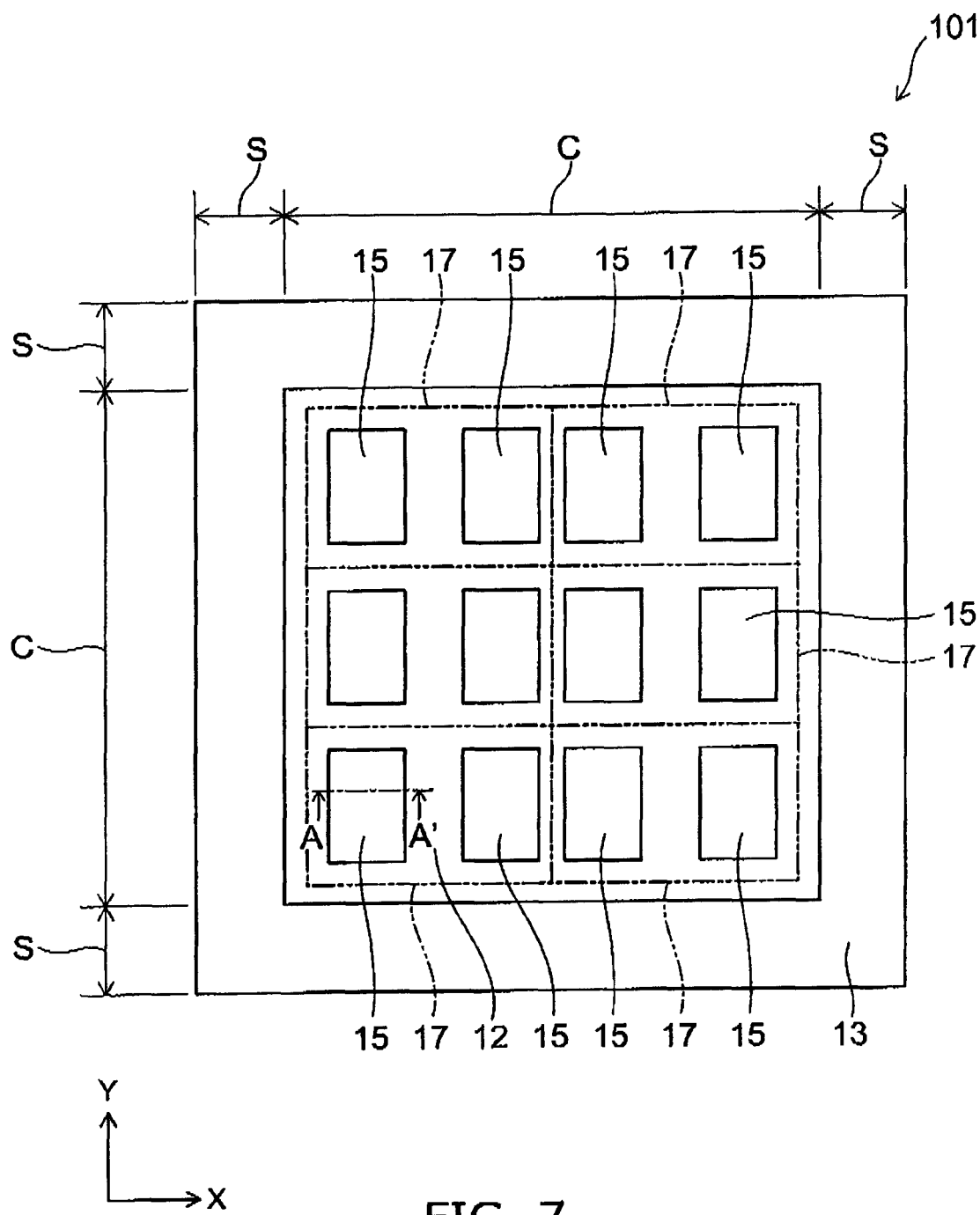
FIG. 7 is a plan view illustrating an exposure mask according to a comparative example of the first embodiment.

FIG. 7 is a plan view illustrating an exposure mask according to the comparative example of this embodiment.

Figure 8:
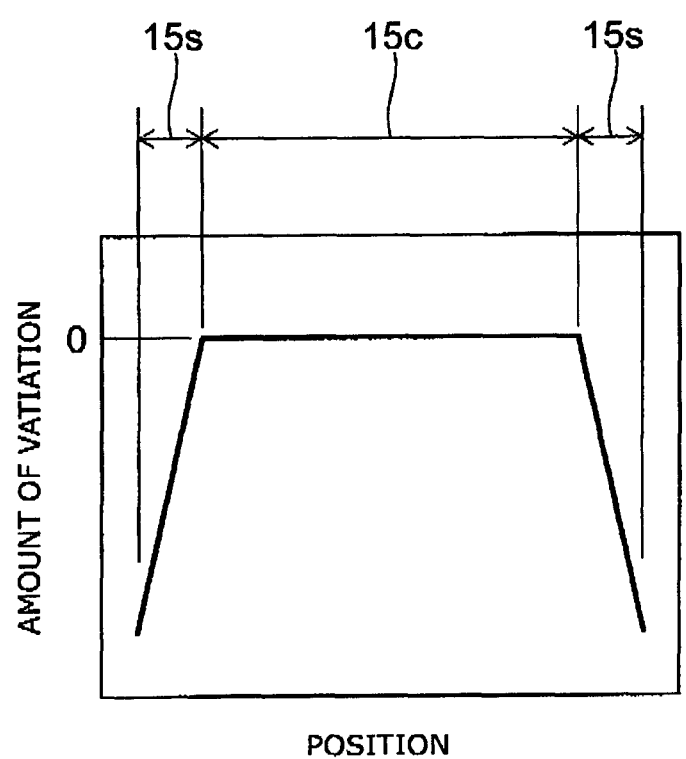
FIG. 8 is a graph schematically showing the dependence of the amount of variation in a width of a pattern element on a position of the pattern element.

FIG. 8 is a graph schematically showing the dependence of the amount of variation in the width of pattern elements on the position of the pattern elements, with an abscissa axis indicative of a position along the line A-A' of FIG. 7 and an ordinate axis indicative of the amount of variation in the width of the pattern elements from the reference value.

Incidentally, the range of values indicated along the abscissa axis in FIG. 8 is selected to correspond with the total length of one pattern formation region 15 in the X-direction on the exposure mask 101 shown in FIG. 7.

As shown in FIG. 7, there is no the sub-pattern P2 (see FIG. 3) on the exposure mask 101 according to the comparative example. The configuration of the exposure mask 101 other than the above is similar to that of the exposure mask 1 (see FIGS. 1 to 3) according to this embodiment. Further, as shown in FIG. 8, the width of pattern elements 16 formed on a peripheral portion 15s of the pattern formation region 15 deviates significantly from the reference value.

The reason for this is most likely as follows. In a developing process shown in FIG. 5A, the pattern elements 16 are formed in all directions surrounding an arbitrary point in a central portion 15c (see FIG. 8) of the pattern formation region 15 and thus the ratio of surrounding portions dissolving and not dissolving of the resist film 32, i.e. a pattern elements occupation ratio is substantially constant in all directions. For this reason, constant processing conditions are maintained during photoresist development and the size of the pattern elements 16 to be formed also becomes stable.

In contrast, when viewed from an arbitrary point in the peripheral portion 15s (see FIG. 8) of the pattern formation region 15, the pattern elements 16 are formed in an inner region of the pattern formation region 15, however, the pattern elements 16 are not formed in an outer region of the pattern formation region 15. Thus the processing conditions in the peripheral portion 15s during photoresist development are different from those in the central portion 15c. For this reason, the size of the pattern elements 16 in the peripheral portion 15s after development may vary as compared to that in the central portion 15c.

In order to solve the above problem, in this embodiment, the sub-pattern elements 19 are formed around the pattern formation region 15. Thus, also in the peripheral portion 15s of the pattern formation region 15, the ratio of portions of the resist film 32 dissolving and not dissolving (pattern elements occupation ratio) is substantially constant in all directions and the processing conditions in the peripheral portion 15s during photoresist development become nearly equal to those in the central portion 15c. Consequently, variations in the width of the pattern elements 16 in the peripheral portion 15s can be prevented. Incidentally, the pattern elements occupation ratio in the sub-pattern formation region 18 may not exactly correspond with that in the pattern formation region 15, but may be, e.g., about one-half of the pattern elements occupation ratio in the pattern formation region 15 while still providing the necessary beneficial effect.

Experimental data indicating this effect will now be discussed.

Figure 9A:
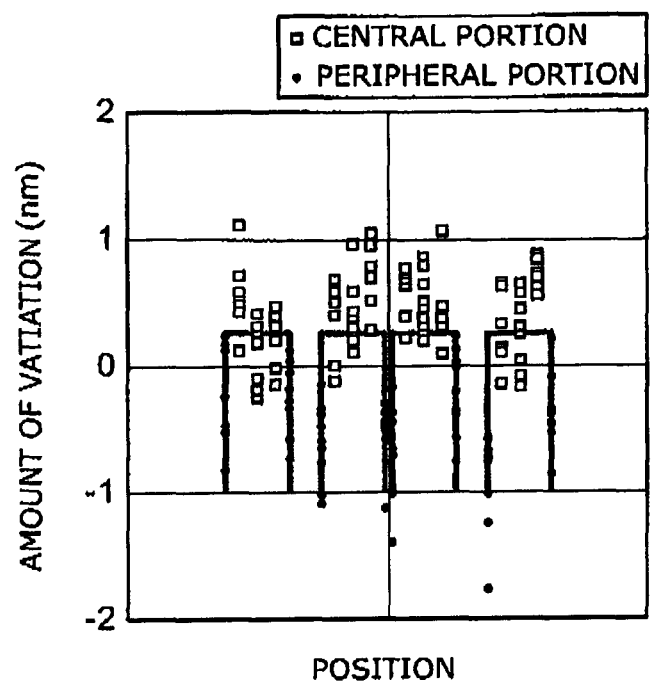
FIGS. 9A and 9B are a graph schematically showing the dependence of the amount of variation in a width of a pattern element on a position of the pattern element.
Figure 9B:
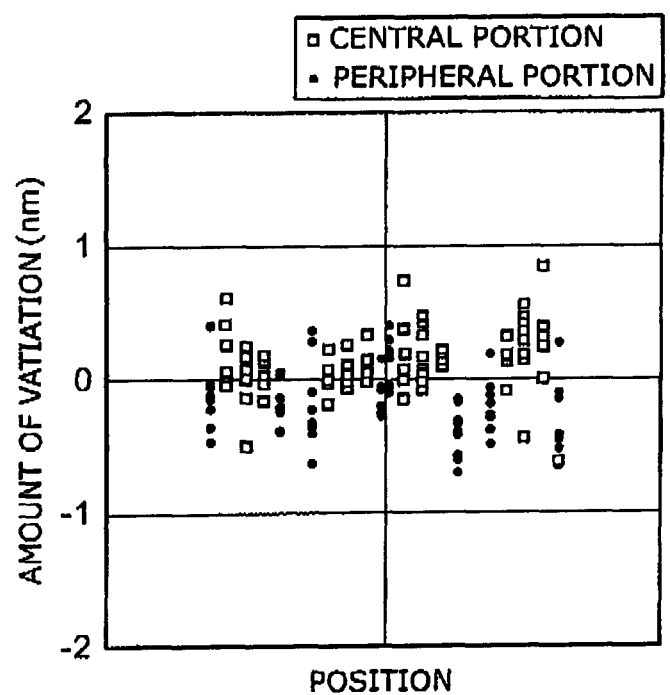

FIGS. 9A and 9B are a graph schematically showing the dependence of the amount of variation in the width of pattern elements on the position where the pattern elements are formed, with an abscissa axis indicative of a position on the exposure mask and an ordinate axis indicative of the measured amount of variation in the width of pattern elements from the reference value. FIG. 9A shows a comparative example and FIG. 9B shows this embodiment.

Incidentally, the range of values indicated along the abscissa axis in FIGS. 9A and 9B is selected to correspond with the total length in the X-direction of the exposure mask 101 shown in FIG. 7 and the exposure mask 1 shown in FIG. 2. Further, in FIGS. 9A and 9B, measured values in the central portion 15c of the pattern formation region 15 are indicated by hollow square markers (□) and measured values in the peripheral portion 15s are indicated by black circle markers (•).

As shown in FIG. 9A, in the comparative example, the width of the pattern elements 16 depends on the position within each pattern formation region 15. Specifically, the measured amounts of variation seen in the plot for the central portion 15c are near 0 nm, whereas the measured amounts of variation for the peripheral portion 15s vary largely in a negative direction. In contrast, as shown in FIG. 9B, in this embodiment, the measured amounts of variation seen in the plot both for the central portion 15c and peripheral portion 15s are near 0 nm. Thus, according to this embodiment, variations in the size of the pattern elements 16 in the peripheral portion 15s of the pattern formation region 15 can be suppressed.

The width of the sub-pattern formation region 18, i.e., a distance between the edges of the sub-pattern formation region 18 which are closer to and farther from the pattern formation region 15 is preferably not less than the width of the peripheral portion 15s of the pattern formation region 15, i.e., the width of a region in which the width of the pattern elements 16 on the exposure mask 101 according to the comparative example varies with respect to the width of the pattern elements 16 in the central portion 15c of the pattern formation region 15. Thus, variations in the size of the pattern elements 16 can be suppressed effectively.

Incidentally, the sub-pattern elements 19 are sized such that pattern elements after being transferred onto the silicon wafer 41 are smaller than the resolution limit. Thus the sub-pattern elements 19 are not transferred onto the resist film 42. For this reason, the presence of the sub-pattern P2 does not affect the pattern P1 transferred onto the silicon wafer 41.

Further, the sub-pattern formation region 18 is spaced from the pattern formation region 15 by a distance having no optical proximity effect from the sub-pattern P2 to the pattern P1. As a result, the presence of the sub-pattern P2 does not affect the shape of the pattern P1, ensuring fidelity of each pattern shape compared to the original design. In this manner, according to this embodiment, an exposure mask with high dimensional accuracy is obtained and enables semiconductor device fabrication with increased device accuracy.

Incidentally, it is also contemplated that pattern data itself may be corrected to equalize the dimensions of the pattern P1 after being transferred onto the wafer. However, this requires that the pattern data representing the pattern elements 16 of the same shape and the same size should differ depending on the positions of the pattern elements 16 to be formed. As a result, the existing hierarchical structure in which the position and shape of the pattern elements are separately stored cannot be applied. This significantly increases the volume of pattern data and is not considered practical. In contrast, according to this embodiment, the pattern data of the pattern P1 itself is not required to be corrected and only the pattern data representing the sub-pattern P2 is added. Thus, the volume of the pattern data is not significantly increased. Further, the existing design resources are reusable.

Further, in this embodiment, the light shielding film 13 is provided in the peripheral section S of the exposure mask 1 and thus the exposure light L incident on peripheral section S does not pass through the exposure mask 1 onto the resist film 42. As a result, exposure of the resist film 42 on one sheet of silicon wafer 41 can be carried out multiple times so that adjacent regions onto which the central sections C of the exposure mask 1 are projected are in the vicinity to one another, thereby increasing the utilization of the silicon wafer 41.

Still further, in this embodiment, pattern elements 16 arranged at a smallest pitch of the pattern P1 extend in the Y-direction and the sub-pattern P2 is a line-and-space pattern extending in the X-direction. Accordingly, the exposure light is implemented as light polarized in the Y-direction to further increase the resolution of the pattern P1 and to further decrease the resolution of the sub-pattern P2. Thus, the pattern P1 tends to be transferred more easily and the sub-pattern P2 tends to be transferred with greater difficulty. Consequently, the above beneficial effects are further enhanced. Incidentally, the above effects are greatest when the directions of extension of the pattern elements 16 and sub-pattern elements 19 are at right angles to one another. However, instead, when the pattern elements 16 and sub-pattern elements 19 intersect at angles other than a right angle with one another, the above effects are achieved to a certain degree.

Still further, in this embodiment, the sub-pattern formation region 18 surrounds the pattern formation region 15 and thus variations in the size of the pattern elements 16 in the entire peripheral portion 15s of the pattern formation region 15 can be suppressed.

Still further, in this embodiment, the size of the sub-pattern elements 19 satisfies the above relationship (1) and therefore the transfer of the sub-patterns P2 onto the wafer can be prevented more reliably.

Incidentally, in this embodiment, although the example in which the sub-pattern elements 19 are sized such that pattern elements after being transferred onto the wafer are smaller than the resolution limit has been shown, this embodiment is not necessarily limited thereto, but may be applied to an example in which the pattern P1 is transferred onto the wafer whereas the sub-pattern P2 is not transferred. For example, even when the sub-pattern elements 19 are sized such that pattern elements after being transferred onto the wafer are not smaller than the resolution limit, the amount of the exposure light may be lower than usual, as long as transfer of the sub-pattern P2 onto the wafer is prevented. In this manner, effects similar to those of this embodiment are obtained.

Next, a first variation of the first embodiment is described.

Figure 10:
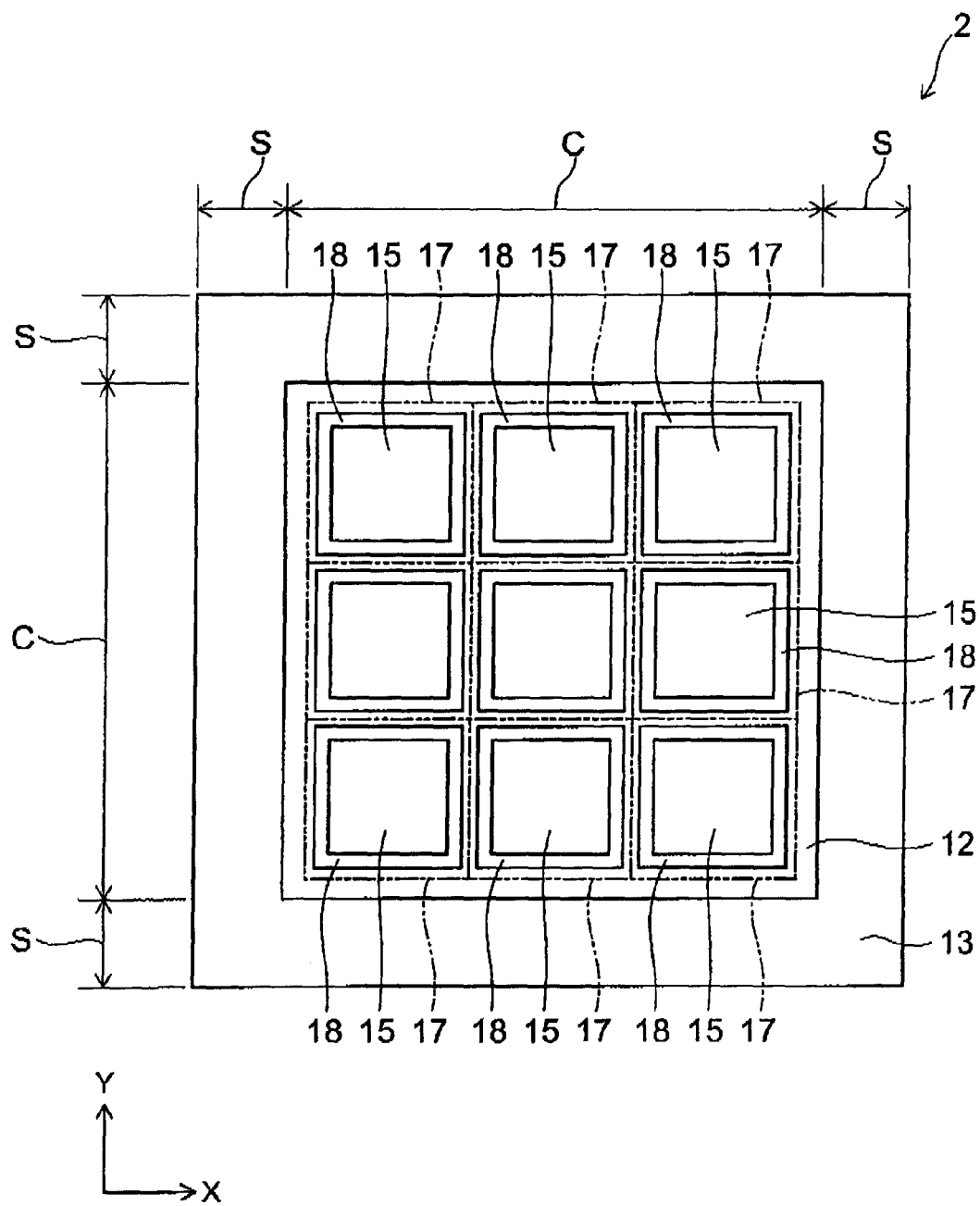
FIG. 10 is a plan view illustrating an exposure mask according to a first variation of the first embodiment.

FIG. 10 is a plan view illustrating an exposure mask according to this variation.

As shown in FIG. 10, in the exposure mask 2 according to this variation, one pattern formation region 15 is provided in each chip area 17. Further, a frame-like sub-pattern formation region 18 is formed to surround each pattern formation region 15 and all the sub-pattern formation regions 18 are spaced from one another. The configuration, manufacturing method, usage, function, and effect of this variation other than the foregoing are the same as those of the above first embodiment.

Next, a second variation of the first embodiment is described.

Figure 11:
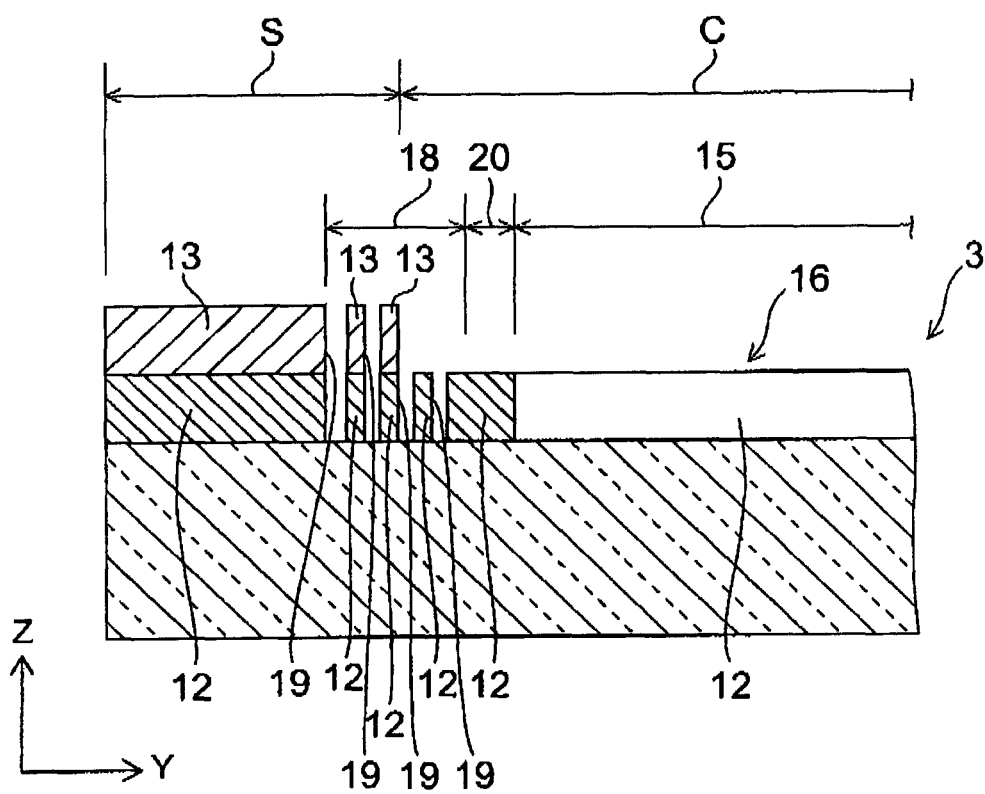
FIG. 11 is a cross-sectional view illustrating an exposure mask according to a second variation of the first embodiment.

FIG. 11 is a cross-sectional view illustrating an exposure mask according to this variation.

As shown in FIG. 11, in the exposure mask 3 according to this variation, a portion of the sub-pattern formation region 18 extends into the peripheral section S. Specifically, a portion of the sub-pattern elements 19 is not formed in a single halftone film 12 but in a laminate of the halftone film 12 and light shielding film 13. Also in this case, the sub-pattern P2 is not transferred onto the wafer, producing effects similar to those of the above first embodiment. The configuration, manufacturing method, usage, function, and effect of this variation other than the foregoing are the same as those of the above first embodiment.

Next, a third variation of the first embodiment is described.

Figure 12:
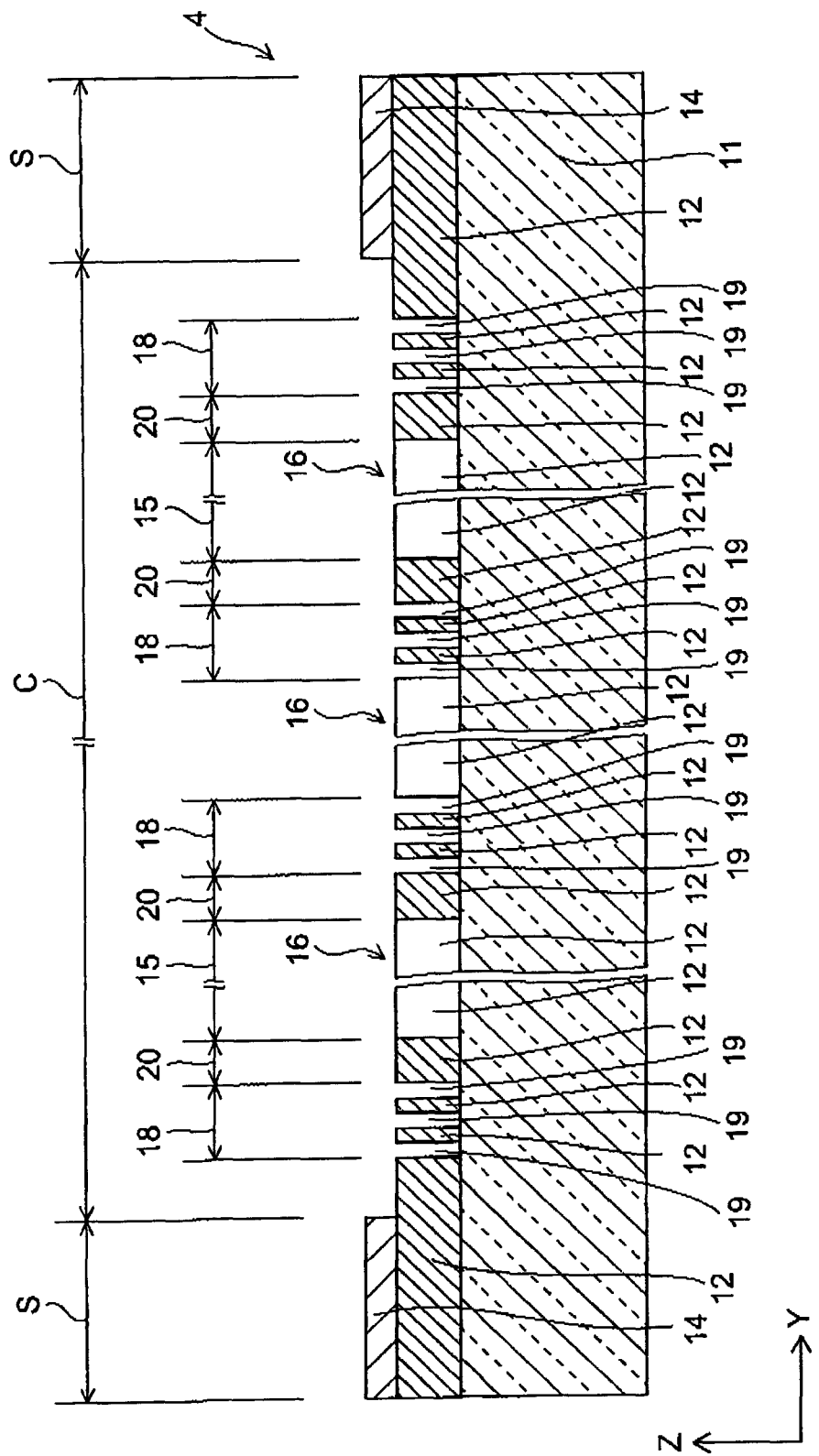
FIG. 12 is a cross-sectional view illustrating an exposure mask according to a third variation of the first embodiment.

FIG. 12 is a cross-sectional view illustrating an exposure mask according to this variation.

As shown in FIG. 12, the exposure mask 4 according to this variation differs from the exposure mask 1 (see FIGS. 1 to 3) according to the above first embodiment in that a film 14 for patterning is provided instead of the light shielding film 13. The film 14 for patterning has been used to manufacture the exposure mask 4 and thinner than the light shielding film 13. The film 14 for patterning is formed of, e.g., chromium. According to this variation, the film 14 for patterning used during the manufacturing of the exposure mask 4 is left in the peripheral section S to serve as a light shielding film, eliminating the need for a dedicated light shielding film 13 and reducing the manufacturing cost. The configuration, manufacturing method, usage, function, and effect of this variation other than the foregoing are the same as those of the above first embodiment.

Next, a fourth variation of the first embodiment is described.

Figure 13:
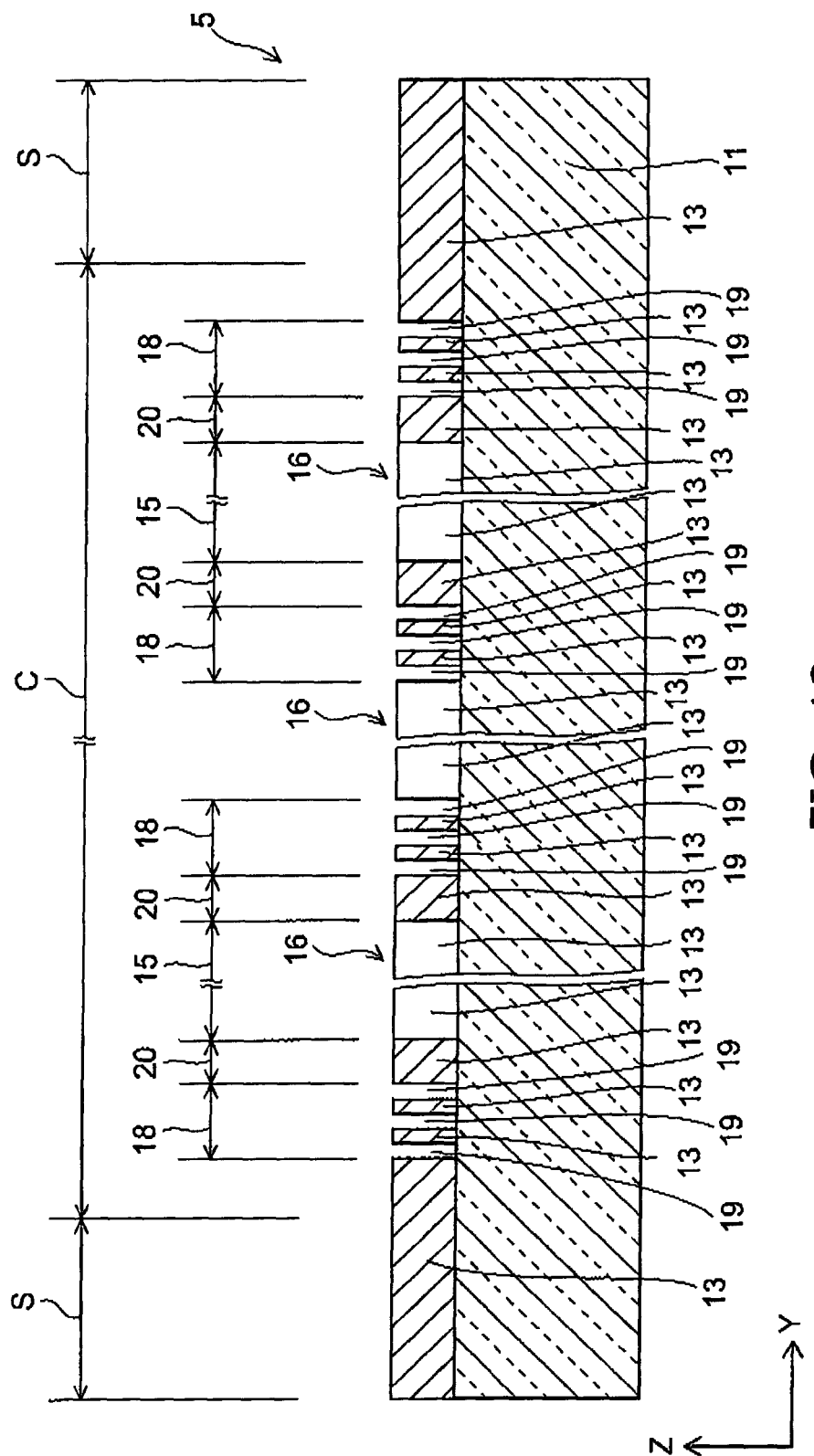
FIG. 13 is a cross-sectional view illustrating an exposure mask according to a fourth variation of the first embodiment.

FIG. 13 is a cross-sectional view illustrating an exposure mask according to this variation.

As shown in FIG. 13, the exposure mask 5 according to this variation differs from the exposure mask 1 (see FIG. 1 to FIG. 3) according to the above first embodiment in that the halftone film 12 is not provided and the light shielding film 13 is provided on the entire surface. Further, the light shielding film 13 is patterned in the central section C to form the pattern elements 16 and sub-pattern elements 19. Specifically, the light shielding film 13 blocking substantially all of exposure light is used as a pattern forming film. The invention may be applied to a photomask including a light shielding film blocking substantially all of the exposure light. The configuration, manufacturing method, usage, function, and effect of this variation other than the foregoing are the same as those of the above first embodiment.

Next, a second embodiment of the invention is described.

Figure 14:
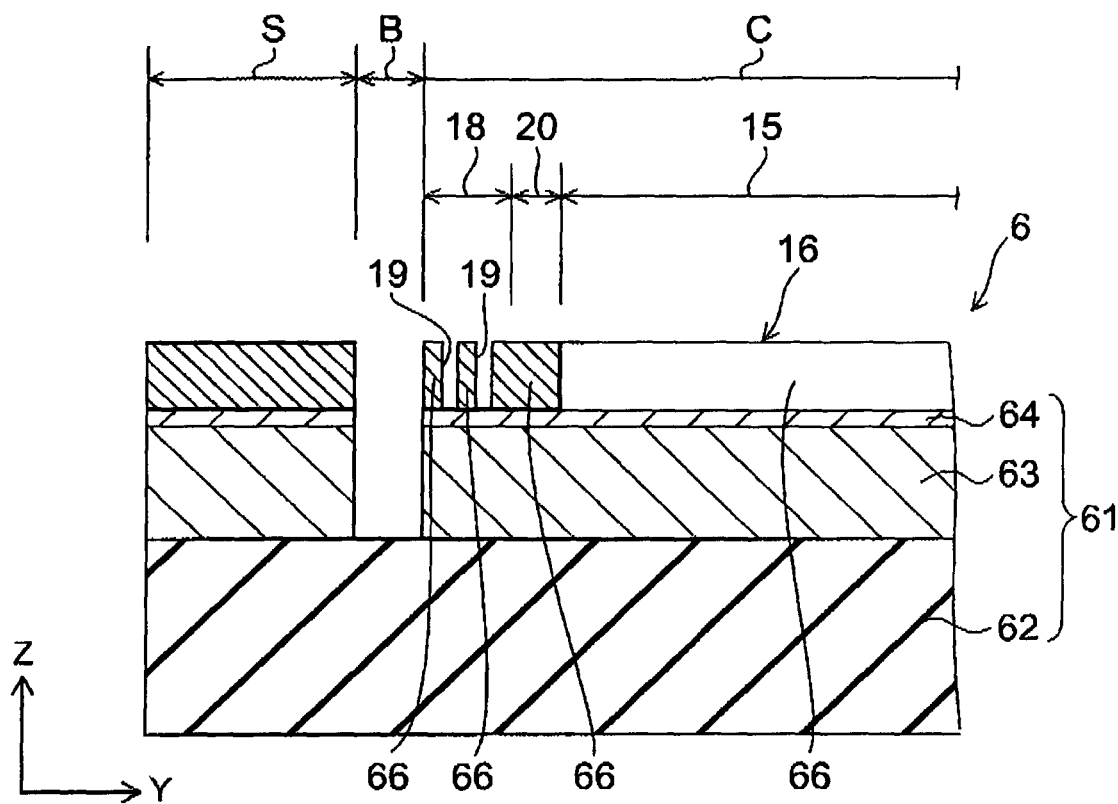
FIG. 14 is a cross-sectional view illustrating an exposure mask according to a second embodiment of the invention.

FIG. 14 is a cross-sectional view illustrating an exposure mask according to this embodiment.

As shown in FIG. 14, the exposure mask 6 according to this embodiment is a reflective EUV mask. The exposure mask 6 includes a substrate 61 reflecting exposure light. The substrate 61 includes a base member 62 of a low thermal expansion glass on which a multilayer film 63 formed by, e.g., alternately laminating forty pairs of silicon layer (not shown) with a thickness of 4.0 nm and molybdenum layer (not shown) of 2.9 nm thickness is provided. A capping layer 64 of, e.g., silicon with a thickness of 11 nm is provided on the multilayer film 63.

Further, a light absorbing film 66 is provided as a pattern forming film on the capping layer 64. The light absorbing film 66 is a two-layer film of a tantalum boron nitride (TaBN) layer with a thickness of 40 nm and a tantalum boron oxide (TaBO) layer with a thickness of 14 nm laminated in this order. The light absorbing film 66 is, e.g., a halftone film allowing a portion of the exposure light to pass therethrough.

Also in this embodiment, similar to the above first embodiment, a sub-pattern formation region 18 is provided around a pattern formation region 15 in a central section C. In the pattern formation region 15, the pattern elements 16 to be transferred onto the wafer are formed, and the pattern elements 16 having a size of the projected image on a wafer not smaller than the resolution limit. In contrast, in the sub-pattern formation region 18, the pattern elements 19 not to be transferred onto the wafer are formed, and the pattern elements 19 having a size of the projected image on the wafer smaller than the resolution limit. The pattern elements 16 and sub-pattern elements 19 are formed by patterning the light absorbing film 66.

On the other hand, in a peripheral section S, the light absorbing film 66 is continuously provided. Moreover, the multilayer film 63, capping layer 64, and light absorbing film 66 are not provided in a boundary B between the peripheral section S and central section C to expose the base member 62. Thus, the boundary B serves as a light shielding area that provides virtually no reflection of the exposure light.

Incidentally, the exposure mask 6 according to this embodiment can be manufactured by using, as a mask blank material, a structure in which the light absorbing film 66 is formed on the entire surface of the substrate 61 and subjecting the structure to a process similar to that of the above first embodiment (see FIGS. 4 and 5). The configuration, manufacturing method, usage, function, and effect of this embodiment other than the foregoing are the same as those of the above first embodiment.

The invention has been described with reference to the embodiments and their variations. However, the invention is not limited to these embodiments and their variations. More specifically, those skilled in the art can suitably modify each of the above embodiments and their variations by addition, deletion, or design change of components, or by addition, omission, or condition change of processes, and such modifications are also encompassed within the scope of the invention as long as they fall within the spirit of the invention.

The invention claimed is:

1. An exposure mask used to transfer a pattern defined by exposure onto a wafer, comprising:
 a substrate;
 a pattern formation region provided on the substrate, wherein the pattern formation region has a plurality of pattern elements formed therein, each of the pattern elements having a size not smaller than a resolution limit for not being imaged onto the wafer; and a sub-pattern formation region provided on the substrate, wherein the sub-pattern formation region has a plurality of sub-pattern elements formed therein, each of the sub-pattern elements having a size smaller than the resolution limit for not being imaged onto the wafer, wherein the sub-pattern formation region is spaced from the pattern formation region by a distance having no optical proximity effect on the pattern formation region, wherein at least a portion of the sub-pattern elements is such that each sub-pattern element in the portion of the sub-pattern elements has a sub-pattern shape that includes a first sub-pattern dimension and a second sub-pattern dimension, wherein the second sub-pattern dimension is perpendicular to the first sub-pattern dimension, wherein the second sub-pattern dimension is smaller than the first sub-pattern dimension, wherein the first sub-pattern dimension extends along a first direction, wherein a portion of the pattern elements arranged at a smallest pitch of the pattern elements is such that each pattern element in the portion of the pattern elements has a pattern shape that includes a first pattern dimension and a second pattern dimension, wherein the second pattern dimension is perpendicular to the first pattern dimension, wherein the second pattern dimension is larger than the first pattern dimension, wherein the second pattern dimension extends along a second direction that is different from the first direction, and wherein two or more of the sub-pattern elements are arranged along the second direction in the sub-pattern formation region, wherein none of the pattern elements is located between the two or more of the sub-pattern elements.

2. The exposure mask according to claim 1, further comprising:

a light shielding film provided in a peripheral section of the exposure mask.

3. The exposure mask according to claim 1, wherein the first direction is perpendicular to the second direction.

4. The exposure mask according to claim 1, wherein the sub-pattern formation region surrounds the pattern formation region.

5. The exposure mask according to claim 1, wherein a distance between a first edge of the sub-pattern formation region on a side of the pattern formation region and a second edge of the sub-pattern formation region on an opposite side of the pattern formation region is not less than a first width of a peripheral portion of the pattern formation region in which a second width of each of the pattern elements varies with respect to a third width of each additional pattern element provided in a central portion of the pattern formation region.

6. The exposure mask according to claim 1, wherein the pattern formation region is provided in a plurality thereof and the plurality of pattern formation regions are spaced apart from one another.

7. The exposure mask according to claim 1, wherein a following relationship is satisfied:

$$R < 0.25 \times \lambda / NA$$

in which R is one-half of a pitch of images of the sub-pattern elements after being projected onto the wafer, NA is a numerical aperture of a lens used for the exposure, and $\lambda$ is a wavelength of a light used for the exposure.

8. The exposure mask according to claim 1, wherein the substrate transmits light used for the exposure.

9. The exposure mask according to claim 1, wherein the substrate reflects light used for the exposure.

* * * * *